United States Patent
Kodavalla

(10) Patent No.: US 9,720,485 B2
(45) Date of Patent: Aug. 1, 2017

(54) SYSTEM AND METHOD FOR DYNAMICALLY ADJUSTING HOST LOW POWER CLOCK FREQUENCY WITHOUT DEPENDING ON PERIPHERAL LOW POWER CLOCK FREQUENCY

(71) Applicant: Vijay Kumar Kodavalla, Bangalore (IN)

(72) Inventor: Vijay Kumar Kodavalla, Bangalore (IN)

(73) Assignee: Wipro Limited, Bangalore (IN)

( * ) Notice: Subject to any disclaimer, the term of this patent is extended or adjusted under 35 U.S.C. 154(b) by 92 days.

(21) Appl. No.: 14/754,475

(22) Filed: Jun. 29, 2015

(65) Prior Publication Data
US 2016/0282921 A1   Sep. 29, 2016

(30) Foreign Application Priority Data
Mar. 24, 2015   (IN) .......................... 1503/CHE/2015

(51) Int. Cl.
| | | |
|---|---|---|
| G06F 1/00 | (2006.01) | |
| G06F 1/32 | (2006.01) | |
| H03L 7/18 | (2006.01) | |
| H03L 7/10 | (2006.01) | |
| H04B 15/02 | (2006.01) | |

(52) U.S. Cl.
CPC ............... *G06F 1/324* (2013.01); *H03L 7/10* (2013.01); *H03L 7/18* (2013.01); *H04B 15/02* (2013.01); *H04B 2215/065* (2013.01)

(58) Field of Classification Search
CPC .. G06F 1/324; H03L 7/18; H03L 7/10; H04B 15/02; H04B 2215/065
See application file for complete search history.

(56) References Cited

U.S. PATENT DOCUMENTS 6,292,903 B1 * 9/2001 Coteus ............... G06F 13/1689
713/401
2010/0169699 A1   7/2010 Fujimoto

OTHER PUBLICATIONS

"MIPI Alliance Standard for Display Serial Interface, V1.0," pp. 1-82 (2006).
(Continued)

*Primary Examiner* — Xuxing Chen
(74) *Attorney, Agent, or Firm* — Finnegan, Henderson, Farabow, Garrett & Dunner, LLP

(57) ABSTRACT

This disclosure relates generally to a host-peripheral interface, and more particularly to system and method for dynamically adjusting a low power clock frequency of a host device upon detecting coupling of a peripheral device to the host device. In one embodiment, a method is provided for dynamically adjusting a low power clock frequency of a host device. The method comprises dynamically determining an initial frequency of a low power clock of the host device at which a low power link between the host device and a peripheral device is operational, computing a low power clock frequency range of the host device based on the initial frequency of the low power clock, assessing the low power link in the low power clock frequency range, and adjusting the low power clock frequency to a typical frequency of the low power clock frequency range based on the assessment.

20 Claims, 8 Drawing Sheets

(56) References Cited

OTHER PUBLICATIONS

Extended European search report from the European Patent Office for counterpart European Application No. EP 15 19 6622 dated Jul. 27, 2016.
MIPI Alliance Specification for Display Serial Interface, Version 1.02.00, pp. i-96 (2010).

* cited by examiner

SYSTEM AND METHOD FOR DYNAMICALLY ADJUSTING HOST LOW POWER CLOCK FREQUENCY WITHOUT DEPENDING ON PERIPHERAL LOW POWER CLOCK FREQUENCY

PRIORITY CLAIM

This U.S. patent application claims priority under 35 U.S.C. §119 to: Indian Application No. 1503/CHE/2015, filed on Mar. 24, 2015. The aforementioned application is incorporated herein by reference in its entirety.

TECHNICAL FIELD

This disclosure relates generally to a host-peripheral interface, and more particularly to system and method for dynamically adjusting a low power clock frequency of a host device upon detecting coupling of a peripheral device to the host device.

BACKGROUND

A communication interface enables data transmission between two or more electronic devices including host and peripheral devices. For example, mobile industry processor interface (MIPI) is widely adopted communication interface standard between a host device and a peripheral device, and is prevalent in products such as mobile electronic devices, digital cameras, display devices, modems, RFIC (radio frequency integrated circuit), and portable tablets and laptop computers. MIPI is standardized interconnect protocol between a host and peripherals and is based on very high-speed serial interface, optimized for power. There are several higher layer standards in MIPI such as a display serial interface (DSI), a camera serial interface (CSI), an interface between radio frequency transceiver integrated circuit and baseband integrated circuit (DigRF) and low latency interface (LLI), and so forth along with physical layer specifications such as D-PHY and M-PHY.

D-PHY specification provides a high-speed serial interface solution for communications between various components in an electronic device. The D-PHY solution is capable of expanding a bandwidth of a transmission interface through a low-power consumption approach. For data transmission, the MIPI D-PHY specification defines two modes—a high-speed mode (<1 Gbps) and a low-power mode (<10 Mbps). The high-speed mode is used for high-speed data traffic and low power mode is used for transferring control information. In high-speed mode, there is a source synchronous clock on a separate lane between the host and peripherals. In contrast, the low power mode is achieved through a bidirectional data lane between the host and peripherals and the clock is expected to be extracted from the bidirectional data lane. Moreover, low power clock frequency of the host is to be manually adjusted within a certain range (typically, 67% to 150%) of low power clock frequency of peripheral connected to the host based on the knowledge of peripheral low power clock frequency published or specified by manufacturer of the peripheral.

However, any variations between peripheral's published low power clock frequency and actual low power clock frequency due to components tolerances may lead to low power link failure between host and peripheral. Similarly, any variations in adjusted host low power clock frequency due to clock adjustment circuitry precision may lead to low power link failure between host and peripheral if adjusted host clock frequency crosses the allowed range around actual low power clock frequency of peripheral. The low power link failure between host and peripheral is catastrophic, as the peripheral will become unusable. Moreover, the static adjustment of the host low power clock frequency for a given peripheral or a set of peripheral may not be suitable for another peripheral.

SUMMARY

In one embodiment, a method for dynamically adjusting a low power clock frequency of a host device is disclosed. In one example, the method comprises dynamically determining an initial frequency of a low power clock of the host device at which a low power link between the host device and a peripheral device is operational. The method further comprises computing a low power clock frequency range of the host device based on the initial frequency of the low power clock. The method further comprises assessing the low power link in the low power clock frequency range. The method further comprises adjusting the low power clock frequency to a typical frequency of the low power clock frequency range based on the assessment.

In one embodiment, a system for dynamically adjusting a low power clock frequency of a host device is disclosed. In one example, the system comprises a circuitry for dynamically adjusting a low power clock frequency of a host device by performing operations comprising dynamically determining an initial frequency of a low power clock of the host device at which a low power link between the host device and a peripheral device is operational. The operations further comprise computing a low power clock frequency range of the host device based on the initial frequency of the low power clock. The operations further comprise assessing the low power link in the low power clock frequency range. The operations further comprise adjusting the low power clock frequency to a typical frequency of the low power clock frequency range based on the assessment.

In one embodiment, a non-transitory computer-readable medium storing processor-executable instructions for dynamically adjusting a low power clock frequency of a host device is disclosed. In one example, the stored instructions, when executed by a processor, cause the processor to perform operations comprising dynamically determining an initial frequency of a low power clock of the host device at which a low power link between the host device and a peripheral device is operational. The operations further comprise computing a low power clock frequency range of the host device based on the initial frequency of the low power clock. The operations further comprise assessing the low power link in the low power clock frequency range. The operations further comprise adjusting the low power clock frequency to a typical frequency of the low power clock frequency range based on the assessment.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Figure 1:
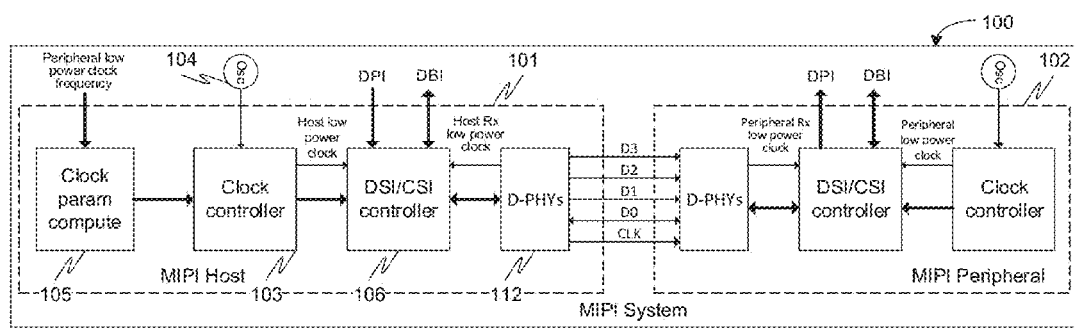
FIG. 1 illustrates a typical mobile industry processor interface (MIPI) system for adjusting a low power clock frequency of a MIPI host device.

Referring now to FIG. 1, a typical mobile industry processor interface (MIPI) system 100 is illustrated. The MIPI system comprises a MIPI host device 101 and a MIPI peripheral device 102. A number of data lanes or data links D0-D3 between the host 101 and the peripheral 102 along with a clock lane enable transmission of data between the host 101 and the peripheral 102. It should be noted that the data lane D0 is bidirectional lane, which is used for low power data transmission.

A clock controller 103 receives input from an oscillator clock (Osc) 104 and parameters from clock parameter compute module 105 and generates host low power clock. Further, it should be noted that the clock controller 103 may generate or control other clocks such as display bus interface (DBI) clock, display pixel interface (DPI) clock, and so forth. The clock controller 103 subsequently outputs the host low power clock apart from other clocks to a DSI/CSI controller 106. As stated above, the DSI/CSI are MIPI higher layer standards for display and camera interfaces respectively.

Figure 2:
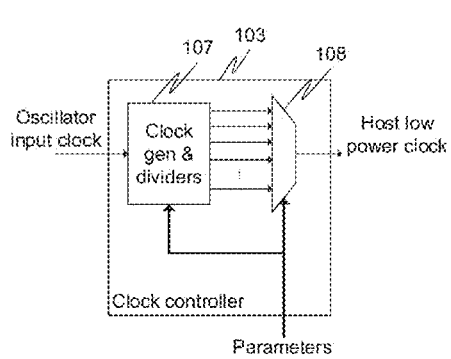
FIG. 2 illustrates a typical clock controller of the MIPI host device.

A typical host clock controller 103 module is illustrated in FIG. 2. The clock controller 103 typically comprises phase locked loops (PLLs) within a series of clock generator and dividers 107 for deriving multiple clocks of varying frequencies based on the oscillator input clock 104 and parameters from clock parameter compute module 105. The clock controller 103 further comprises a clock multiplexer 108 for selecting one among many clocks available at output of the clock generator and dividers 107. The input parameters from clock parameter compute module 105 also configures the clock multiplexer 108.

In operation, the MIPI host 101 initiates low power writes using host low power clock on to D0 data lane. However, as discussed above, MIPI host 101 has to adjust its low power clock frequency to within certain specified range of peripheral low power clock frequency before performing any data transmission. As will be appreciated by those skilled in the art, the MIPI host 101 is required to adjust its low power clock frequency whenever there is addition or change in the peripheral device 102. It should be noted that the MIPI host 101 has flexibility to set its low power clock frequency to any value within the predetermined range. For example, in DSI/CSI/D-PHY MIPI system, host 101 has to adjust its low power clock frequency to within the range of 67% to 150% of peripheral low power clock frequency.

As discussed above, a peripheral manufacturer typically specifies low power clock frequency employed by the peripheral device 102. The host device has to adjust its low power clock frequency depending on low power clock frequency of the peripheral as specified. This is achieved by using clock parameter compute module 105. This module receives peripheral low power clock frequency and adjusts the parameters that are fed to clock controller 103 such that host low power clock frequency is within specified range of peripheral low power clock frequency. The typical parameters include clock multiplication factors, division factors and clock multiplexer select lines.

Figure 3:
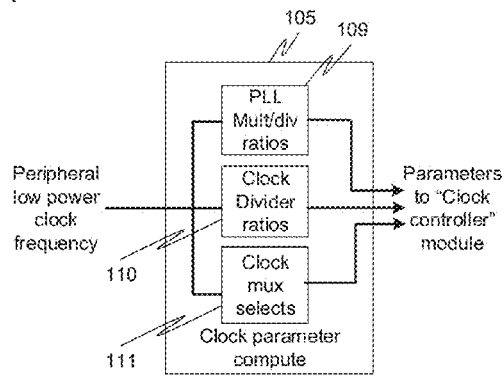
FIG. 3 is a functional block diagram of a typical clock parameter compute module of the MIPI host device.

A functional block diagram of a typical clock parameter compute module 105 of the host device 101 is illustrated in FIG. 3. The clock parameter compute module 105 manually receives peripheral low power clock frequency and computes various parameters employed by the clock controller module 103. The parameters include PLL multiplication and division factors 109 needed for achieving set frequency of host low power clock. The clock parameter compute module 105 also computes clock divider ratios 110 and clock multiplexer selects 111 employed by the clock controller module 103 for achieving set frequency of host low power clock. Therefore, as discussed above, adjustment of host low power clock frequency in the existing MIPI systems is dependent on low power clock frequency of peripheral it is connected to.

Figure 4:
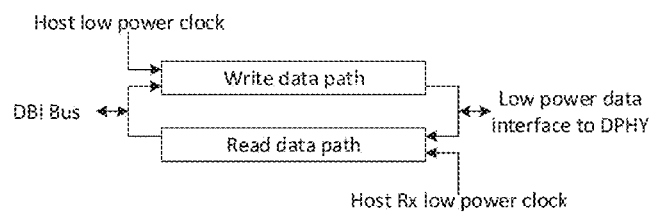
FIG. 4 illustrates a typical DSI/CSI host controller control-data path by way of an example.

Further, the D-PHY 112 generates receive (Rx) low power clock by EX-OR logic gate of D0 data differential lanes in low power mode and sends it to DSI/CSI controller 106, as part of PHY protocol interface (PPI), separately in both host (Host Rx low power clock) and peripherals (Peripheral Rx low power clock). The host 101 writes control-data in host low power clock domain, whereas it reads control-data in host Rx low power clock domain. Similarly, peripheral 102 reads control-data in peripheral Rx low power clock domain and writes control-data in peripheral low power clock domain. Thus, in certain cases, low power clock frequency of host 101 and peripheral 102 devices need not be same but may actually differ. However, the ratio between low power clock frequency of host 101 and peripheral 102 is constrained to ensure proper bus turn around (BTA) behavior. The DSI/CSI controller 106 sends or receives high-speed video data from a video source on DPI interface. Similarly, the DSI/CSI controller 106 sends or receives low power control-data on DBI interface. Further, MIPI host 101 can read from MIPI peripheral 102 through same bidirectional lane D0. FIG. 4 illustrates an exemplary DSI/CSI host controller control-data path between DBI and D0 data lane.

As stated above, current MIPI standard necessitates adjustment of low power host clock frequency to a predetermined range that is within the allowable range of the peripheral. For this purpose peripheral manufacturer publishes low power clock frequency of the peripheral. However, variations between peripheral's published low power clock frequency and actual low power clock frequency, due to components tolerances and variations in adjusted host low power clock frequency due to clock adjustment circuitry precision, may lead to low power link failure between host and peripheral, if adjusted host clock frequency crosses the allowed range around actual low power clock frequency of peripheral. The low power link failure between host and peripheral is catastrophic, as peripheral will become unusable. Moreover, the static adjustment of the host clock frequency (HCF) for a given peripheral or a set of peripherals may not be suitable for another peripheral.

It is therefore desirable to provide a system and method for dynamic adjustment of a low power clock frequency of a host device without depending on individual peripheral's low power clock frequency, whenever there is a new peripheral coupled to host device or whenever there is a change in the connected peripherals.

Figure 5:
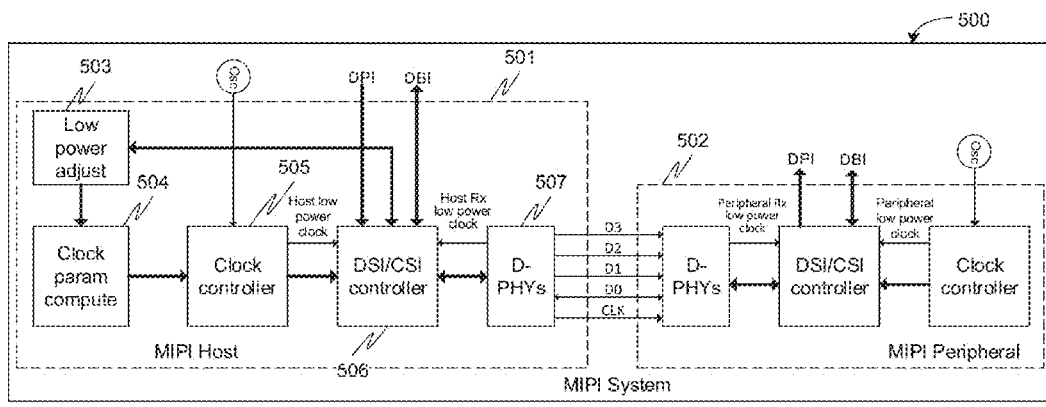
FIG. 5 illustrates an exemplary system in which a low power clock frequency of a host device is automatically and dynamically adjusted according to some embodiments of the present disclosure.
Figure 6:
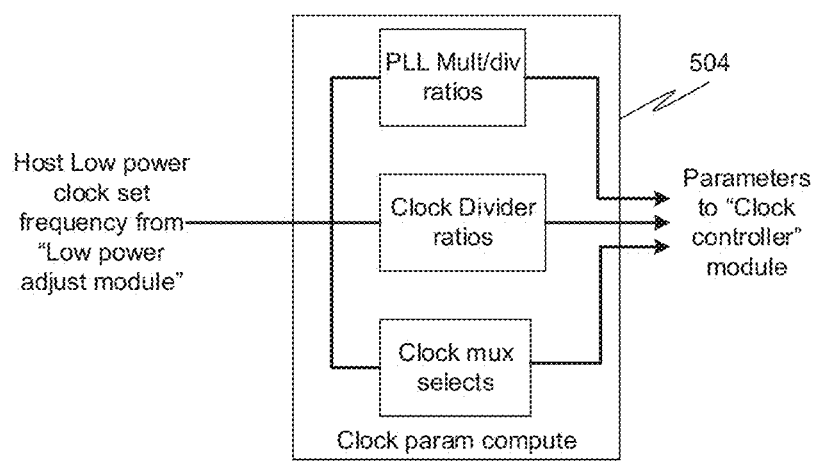
FIG. 6 is a functional block diagram of an exemplary clock parameter compute module of the host device according to some embodiments of the present disclosure.

Referring now to FIG. 5, an exemplary system 500 in which a low power clock frequency of a host device is automatically and dynamically adjusted is illustrated according to some embodiments of the present disclosure. The system 500 comprises a host 501 and at least one peripheral 502. In certain embodiments, the system 500 is a computing or a mobile device comprising a MIPI circuitry. The MIPI circuitry comprises a MIPI host and at least one MIPI peripheral. In comparison to the existing system 100 discussed above, the host device 501 of the disclosed system 500 comprises a low power adjust module 503. The low power adjust module 503 will be described in greater detail herein below. The clock parameter compute module 504 in MIPI host 501 receives host low power clock set frequency from low power adjust module 503 and adjusts the parameters to clock controller 505. A functional block diagram of clock parameter compute module in the system 500 is shown in FIG. 6. As will be appreciated by those skilled in the art, the input to clock parameter compute module 504 is host low power clock set frequency from low power adjust module 503 whereas in the existing system it is peripheral low power clock frequency.

Figure 7:
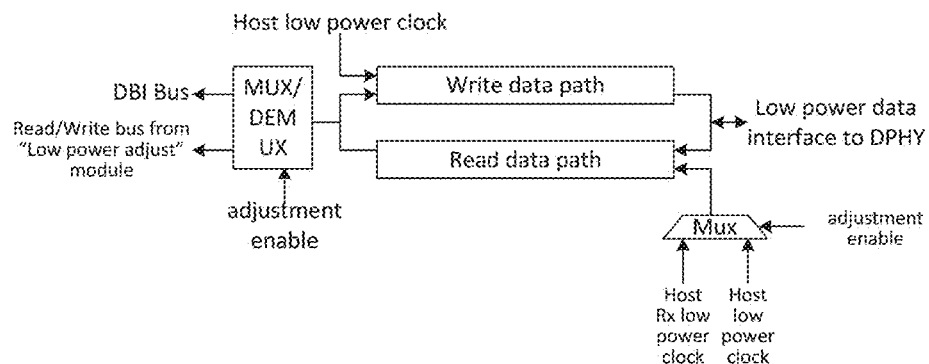
FIG. 7 illustrates an exemplary DSI/CSI host controller control-data path according to some embodiments of the present disclosure.

Referring now to FIG. 7, an exemplary DSI/CSI host controller control-data path is illustrated according to some embodiments of the present disclosure. As will be appreciated by those skilled in the art, there is a difference in the way control-data is handled by DSI/CSI Host controller 506 of the system 500 as compared to that in existing system discussed above. As illustrated, the host writes control-data in host low power clock domain, whereas it reads control-data in host low power clock domain, while automatically adjusting it ('adjustment enable' is set) and host Rx low power clock domain, after adjusting ('adjustment enable' is reset) host low power clock frequency. The 'adjustment enable' signal is driven from low power adjust module 503. This signal will be set when host low power clock frequency is being adjusted and will be reset after adjustment is over. Another difference with respect to the existing system is that read/write control-data will be driven by low power adjust module 503 while adjustment is going on. However once the adjustment is over, DBI bus will be driving the read/write control data. The selection is again through 'adjustment enable' signal.

Figure 8:
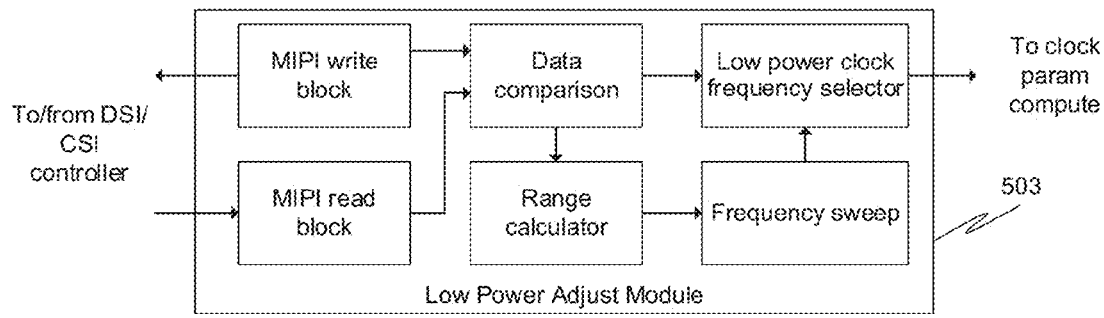
FIG. 8 is a functional block diagram of an exemplary low power adjust module of the host device according to some embodiments of the present disclosure.

FIG. 8 illustrates a functional block diagram of an exemplary low power adjust module 503 of the host device 501 according to some embodiments of the present disclosure. The low power adjust module 503 sweeps host low power clock frequency, and performs writes and reads on to MIPI peripheral 502 through DSI/CSI controller 506 and D-PHYs 507. Further, the low power adjust module 503 automatically determines a valid host low power frequency range in which the low power data link D0 works during auto sweep and allocates a valid frequency to the host low power clock. Additionally, the low power adjust module 503 interfaces to DSI/CSI controller 506 for performing writes and reads onto MIPI peripheral 502. Moreover, the low power adjust module 503 compares write and read data to check data parity, sweeps the low power clock frequency, calculates its range, and selects and sends a selected low power clock frequency to clock parameter compute module 504.

In other words, low power adjust module 503 dynamically determines a low power clock frequency range of the host in which the low power link between the host and the peripheral is operational upon detecting a new peripheral or a change in the peripheral. The low power adjust module 503 subsequently adjusts a host low power clock frequency to a typical frequency of the host low power clock frequency range. As will be appreciated, the adjustment of host low power clock frequency is without depending on peripheral low power clock frequency. The low power adjust module 503 may determine the host low power clock frequency range of the host in which the low power link between the host and the peripheral is operational in variety of ways.

For example, in certain embodiments, the low power adjust module may dynamically determine an initial frequency of a host low power clock at which the low power link is operational, compute the host low power clock frequency range based on the initial frequency so determined, and assess whether the low power link is operational in the computed host low power clock frequency range. Alternatively, in certain embodiments, the low power adjust module may sweep multiple frequencies of the host low power clock, assess whether the low power link is operational at each of the multiple frequencies, and determine the host low power clock frequency range based on the assessment.

The low power adjust module 503 performs one or more of following primary functions: (1) sweeping host low power clock frequency and determining valid host low power clock frequency range, (2) assessing the low power link in the determined host low power clock frequency range i.e., checking whether host-peripheral links works in the determined host low power clock frequency range, and (3) allocating a valid frequency to host low power clock. Each of these functions will now be described in greater detail herein below.

By way of an example, in the first function, the low power adjust module 503 automatically sweeps host low power clock frequency and dynamically determines valid host low power clock frequency range. To start with, in the sweeping step, the low power adjust module 503 sets host low power clock frequency at highest predefined value say 20 MHz. In subsequent iterations, instead of the set highest value of host low power clock frequency, an updated lower value back from respective steps is used. Alternatively, it should be noted that the low power adjust module 503 may set host low power clock frequency at lowest predefined value at the start and in subsequent iterations an updated higher value from respective steps may be used.

In the determining step, the low power adjust module 503 assesses the low power link at the set or updated frequency by checking whether host-peripheral low power link works with given setting of host low power clock frequency. This check involves following steps: initiating a write command from the host device to write data on at least one register of the peripheral device, initiating a read command by the host device to read data from the at least one register of the peripheral device, and comparing the read data with the write data for a data parity.

The low power adjust module 503 initiates write into some or all of peripheral registers using commands like generic long write or display command set (DCS) write. The write data used may be predetermined such as incremental data patterns. The low power adjust module 503 then initiates read into same peripheral registers where writes were initiated using commands like generic long read or DCS read. These write and read commands may be initiated by the low power adjust module 503 through the CSI/DSI controller 506 and the D-PHYs 507 on the host device 501. The host device 501 then turn around the bus and waits for the requested read data from the peripheral device 502. If read data is received from the peripheral, it will be latched and compared with predetermined write data patterns used. If data matches i.e. if there is data parity, it is determined that host-peripheral link is working with the set host low power clock frequency. The comparison and decision is taken in the low power adjust module 503. However, if read data is not received or if read data does not match with write data, the host 501 times out bus turnaround time and determines that host-peripheral link has failed. In case the link is determined as failed, this function rolls back to sweeping step and the low power adjust module 503 updates the host low power clock frequency to a lower value or a higher value than previously set. The determining step is then repeated and this process continues until host-peripheral link works.

The first frequency at which the low power link is operational provides the initial frequency of the host low power clock. The host low power clock frequency range may then be determined by continuing with the above iterative process till the host-peripheral link is working. The last frequency at which the low power link is operational provides the final frequency of the host low power clock. The initial and the final frequencies provide the host low power clock frequency range. As will be appreciated by those skilled in the art, the initial frequency may be maximum frequency of the range while final frequency may be minimum frequency of the range if the host low power clock frequency was set at highest predefined value at the start. Similarly, the initial frequency may be minimum frequency of the range while final frequency may be maximum frequency of the range if the host low power clock frequency was set at lowest predefined value at the start.

Alternatively, host low power clock frequency range may be determined based on the initial frequency of the host low power clock. Whenever host-peripheral link works, the low power adjust module 503 may terminate the first function and computes the host low power clock frequency range by determining a maximum, a minimum, and a typical low power clock frequencies based on the initial frequency of the low power clock and one or more predetermined ratios. In one example, if the host low power clock frequency was set at highest predefined value at the start, the low power adjust module 503 assigns and computes the host low power clock frequency range as follows:

Range maximum value=host low power clock frequency set or updated value in this function, where host-peripheral link works Range typical value=Range maximum value×predetermined typical to maximum guard ratio Range minimum value=Range typical value×predetermined minimum to typical guard ratio Further, in one example, predetermined typical to maximum and minimum to typical guard ratios can be set to ⅔ and ⅔ respectively.

By way of another example, in the second function, the low power adjust module 503 assesses the quality of the low power link by checking whether host-peripheral link works in the host low power clock frequency range computed in first function. It should be noted that the low power adjust module 503 may perform the second function in those scenarios where the host low power clock frequency range was computed based on the initial frequency and the one or more ratios. For each of a set of frequencies selected from within the low power clock frequency range, this check involves following steps: initiating a write command from the host device to write data on at least one register of the peripheral device, initiating a read command by the host device to read data from the at least one register of the peripheral device, and comparing the read data with the write data for a data parity.

The low power adjust module 503 sets host low power clock frequency at maximum or minimum value of the computed host low power clock frequency range. The low power adjust module 503 then initiates write into some or all of peripheral registers using commands like generic long write or display command set (DCS) write. The write data used may be predetermined such as incremental data patterns. The low power adjust module 503 then initiates read into same peripheral registers where writes were initiated using commands like generic long read or DCS read. These write and read commands may be initiated by the low power adjust module 503 through the CSI/DSI controller 506 and the D-PHYs 507 on the host device 501. The host device 501 then turn around the bus and waits for the requested read data from the peripheral device 502. If read data is received from the peripheral, it will be latched and compared with predetermined write data patterns used. If data matches i.e.

if there is data parity, it is determined that host-peripheral link is working with the set host low power clock frequency. The comparison and decision is taken in the low power adjust module 503. However, if read data is not received or if read data does not match with write data, the host 501 times out bus turnaround time and determines that host-peripheral link has failed. In case the host-peripheral link is working, this function iteratively rolls back to frequency setting step and the low power adjust module 503 updates the host low power clock frequency to a lower value or a higher value than previously set. The above iterative step is performed as long as host-peripheral link is working and computed range minimum or maximum value is not reached by the updated host low power clock frequency. If host-peripheral link works till updated host low power clock frequency reaches computed range minimum or maximum value, it is declared that check is passed and the low power adjust module 503 moves on to third function i.e., allocation of a valid frequency to host low power clock. However, if host-peripheral link failure occurs at least once, this function will be terminated and the low power adjust module 503 rolls back to first function, with host low power clock frequency updated to a value where the host-peripheral link failure occurs.

By way of further example, in the third function, the low power adjust module 503 allocates a valid frequency to host low power clock from within the host low power clock frequency range. Once the low power adjust module 503 checks and validates that low power link is working in entire range of host low power clock frequencies computed in at least one of the first and second function, this function will allocate valid frequency to host low power clock from within the host low power clock frequency range. In one example, host low power clock frequency is adjusted to a computed typical frequency of the low power clock frequency range.

It should be noted that the low power adjust module 503 and other such modules may be implemented in programmable hardware devices such as programmable gate arrays, programmable array logic, programmable logic devices, and so forth. Alternatively, the low power adjust module may be implemented in software for execution by various types of processors. An identified engine of executable code may, for instance, comprise one or more physical or logical blocks of computer instructions which may, for instance, be organized as an object, procedure, function, module, or other construct. Nevertheless, the executables of an identified engine need not be physically located together, but may comprise disparate instructions stored in different locations which, when joined logically together, comprise the engine and achieve the stated purpose of the engine. Indeed, an engine of executable code could be a single instruction, or many instructions, and may even be distributed over several different code segments, among different applications, and across several memory devices.

As will be appreciated by one skilled in the art, a variety of processes may be employed for dynamically adjusting a host low power clock frequency. In particular, a variety of processes may be employed for dynamically adjusting the host low power clock frequency upon detecting a coupling of a peripheral device to the host device and without depending on a peripheral low power clock frequency. For example, the exemplary system 500 and the associated low power adjust module 503 may dynamically adjust the host low power clock frequency by the processes discussed herein. In particular, as will be appreciated by those of ordinary skill in the art, control logic and/or automated routines for performing the techniques and steps described herein may be implemented by the system 500 and the associated low power adjust module 503, either by hardware, software, or combinations of hardware and software. For example, suitable code may be accessed and executed by the one or more processors on the system 500 to perform some or all of the techniques described herein. Similarly application specific integrated circuits (ASICs) configured to perform some or all of the processes described herein may be included in the one or more processors on the system 500.

Figure 9:
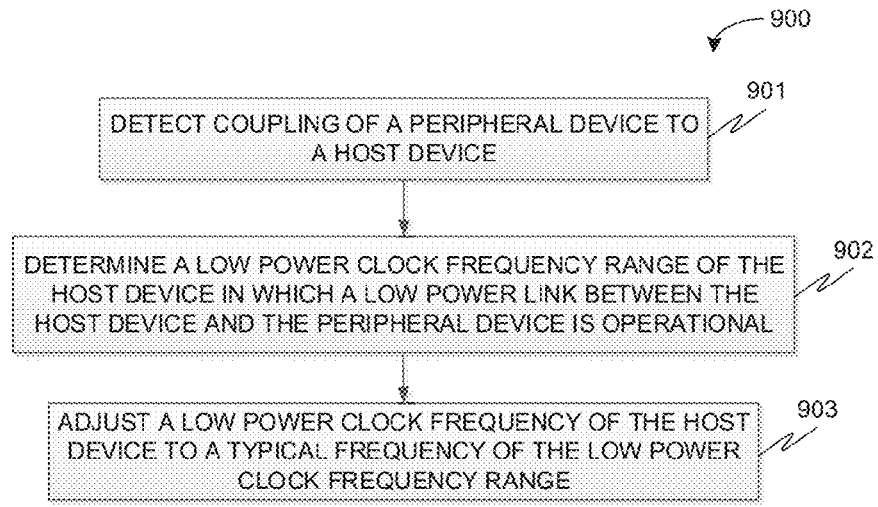
FIG. 9 is a flow diagram of an exemplary process for dynamically adjusting a host low power clock frequency in accordance with some embodiments of the present disclosure.

For example, referring now to FIG. 9, exemplary control logic 900 for dynamically adjusting a host low power clock frequency via a system, such as system 500, is depicted via a flowchart in accordance with some embodiments of the present disclosure. As illustrated in the flowchart, the control logic 900 includes the steps of detecting coupling of a peripheral device to a host device at step 901, determining a low power clock frequency range of the host device in which a low power link between the host device and a peripheral device is operational at step 902, and adjusting a low power clock frequency of the host device to a typical frequency of the low power clock frequency range at step 903.

In certain embodiments, the exemplary control logic 900 may further include the step of setting a control-data read clock of the host device to the low power clock of the host device. Further, in some embodiments, adjusting at step 903 comprises adjusting the low power clock frequency to the typical frequency of the low power clock frequency range for which a data parity occurred throughout the low power clock frequency range while assessing. In certain embodiments, the exemplary control logic 900 may further include the step of resetting a control-data read clock of the host device to a receive low power clock of the host device.

Figure 10:
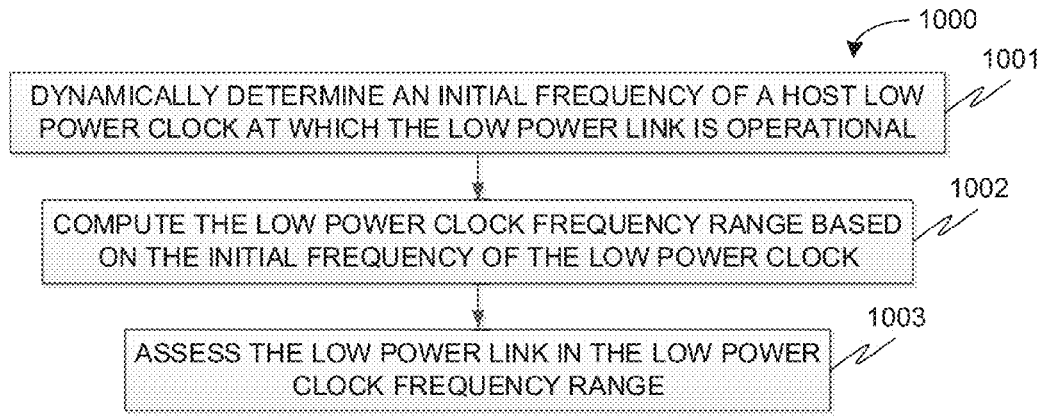
FIG. 10 is a flow diagram of an exemplary process for determining a host low power clock frequency range in which a host-peripheral low power link is operational in accordance with some embodiments of the present disclosure.

Further, a variety of processes may be employed for determining a host low power clock frequency range in which a host-peripheral low power link is operational at step 902. For example, referring now to FIG. 10, exemplary control logic 1000 for determining a host low power clock frequency range in which a host-peripheral low power link is operational is depicted via a flowchart in accordance with some embodiments of the present disclosure. As illustrated in the flowchart, the control logic 1000 includes the steps of dynamically determining an initial frequency of a low power clock of the host device at which the low power link between the host device and the peripheral device is operational at step 1001, computing the low power clock frequency range of the host device based on the initial frequency of the low power clock at step 1002, and assessing the low power link in the low power clock frequency range at step 1003.

In certain embodiments, dynamically determining at step 1001 may further include the steps of sweeping a plurality of frequencies of the low power clock of the host device, assessing the low power link at each of the plurality of frequencies, and determining the initial frequency of the low power clock based on the assessment. Further, in certain embodiments, sweeping the plurality of host low power clock frequencies comprises setting, at a first instance, the low power clock frequency to a pre-determined frequency and iteratively setting, at a subsequent instance, the low power clock frequency to an updated frequency. In certain embodiments, assessing the low power link at each of the plurality of frequencies may further include the steps of initiating a write command from the host device to write data on at least one register of the peripheral device, initiating a read command by the host device to read data from the at least one register of the peripheral device, and comparing the read data with the write data for a data parity. Further, in certain embodiments, determining the initial frequency of the low power clock comprises determining a frequency from the plurality of frequencies at which a data parity occurred while assessing.

Additionally, in certain embodiments, computing the low power clock frequency range at step 1002 comprises determining a maximum, a minimum, and a typical low power clock frequencies based on the initial frequency of the low power clock and one or more predetermined ratios. Moreover, in certain embodiments, assessing the low power link in the low power clock frequency range at step 1003 comprises assessing the low power link for each of a set of frequencies selected from within the low power clock frequency range by initiating a write command from the host device to write data on at least one register of the peripheral device, initiating a read command by the host device to read data from the at least one register of the peripheral device, and comparing the read data with the write data for a data parity.

Figure 11:
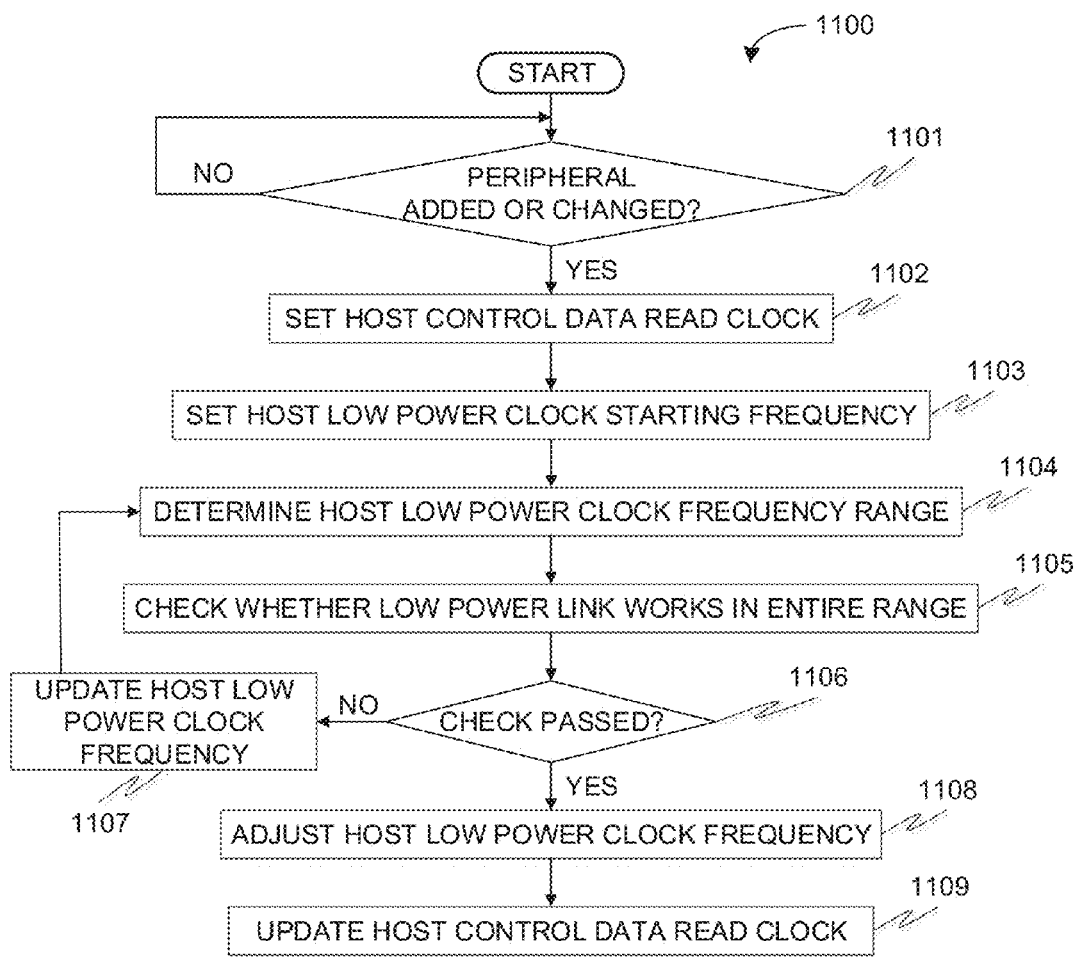
FIG. 11 is a flow diagram of a detailed exemplary process of FIG. 9 using process of FIG. 10 in accordance with some embodiments of the present disclosure.

Referring now to FIG. 11, exemplary control logic 1100 for dynamically adjusting a host low power clock frequency is depicted via a flowchart in accordance with some embodiments of the present disclosure. The control logic 1100 depicts in greater detail the control logic 900 which employs the control logic 1000. As illustrated in the flowchart, the control logic 1100 includes the step of checking whether a new peripheral is added or existing peripheral is changed at step 1101. The control logic 1100 further includes the step of setting host control-data read clock to host low power clock at step 1102. The above step is performed in DSI/CSI host controller control-data path described in FIG. 7 by an 'adjust enable' signal driven from the low power adjust module described in FIG. 8. The control logic 1100 further includes the step of setting host low power clock starting frequency to a predetermined highest or lowest value allowed at step 1103. The above step is performed in the low power adjust module and will drive parameters to clock parameter compute module described in FIG. 6. The control logic 1100 further includes the step of determining an initial host low power clock frequency at which low power link between host and peripheral works and corresponding minimum-typical-maximum range of such clock frequency at step 1104. The above step is performed in the low power adjust module by writing and reading control-data to and from DSI/CSI Host controller control-data path and will be described in greater detail herein below with respect to FIG. 12. The control logic 1100 further includes the step of assessing the host-peripheral low power link in the determined range i.e., checking whether low power link between host and peripheral works in the determined range of minimum-maximum host low power clock frequency at step 1105. Again, the above step is performed in the low power adjust module by writing and reading control-data to and from DSI/CSI Host controller control-data path and will be described in greater detail herein below with respect to FIG. 13. The control logic 1100 further includes the step of checking at step 1106 whether the check at step 1105 is successful. The above step is performed in the low power adjust module. If the check at step 1106 fails, then the control logic 1100 includes the step of updating host low power clock frequency to a lower or higher frequency than the frequency at which link failure has occurred at step 1107. The frequency is updated to a lower value if the host low power clock starting frequency was set to the predetermined highest value and vice versa. The above step is performed in the low power adjust module and will drive parameters to the clock parameter compute module. The control logic then flows back to step 1104 and the process is iteratively repeated until check at step 1106 is successful. If the check at step 1106 is successful, the control logic 1100 includes the step of adjusting host low power clock frequency to a typical frequency of the host low power clock frequency range (determined in step 1104) at step 1108. The above step is performed in the low power adjust module and will drive parameters to the clock parameter compute module. Additionally, the control logic 1100 includes the step of updating or resetting host control-data read clock to host receive (Rx) low power clock at step 1109. The above step is performed in the DSI/CSI host controller control-data path by the 'adjust enable' signal driven from the low power adjust module.

Figure 12:
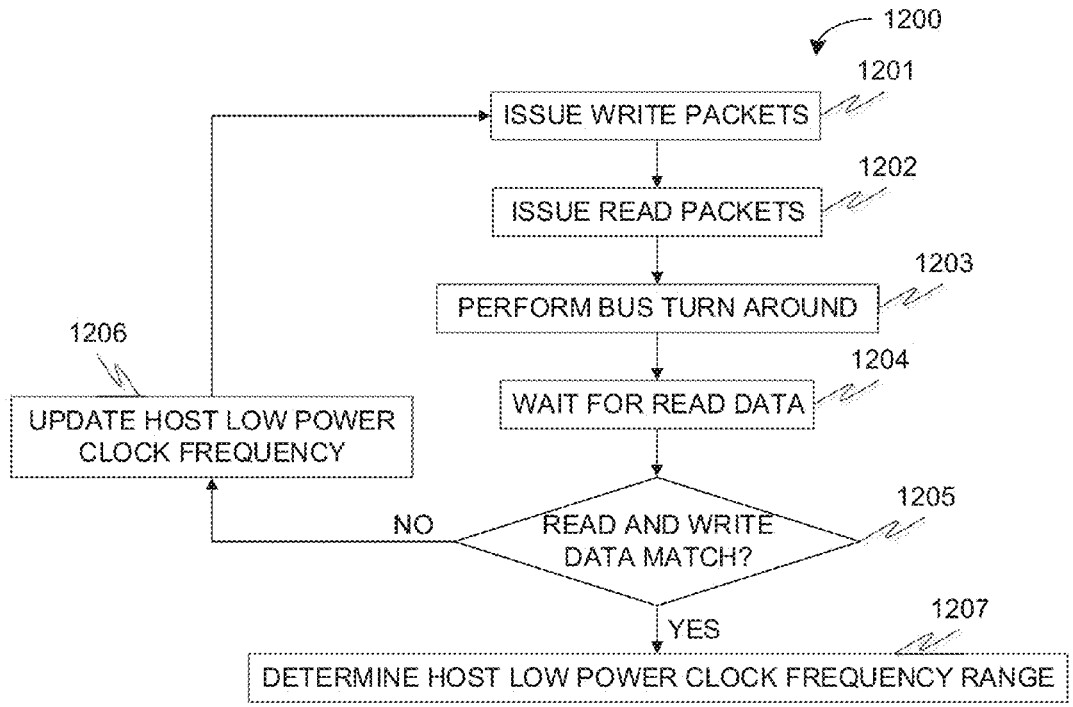
FIG. 12 is a flow diagram of a detailed exemplary process for determining the host low power clock frequency range of FIG. 11 in accordance with some embodiments of the present disclosure.

Referring now to FIG. 12, exemplary control logic 1200 for determining the host low power clock frequency range at step 1104 is depicted in greater detail via a flowchart in accordance with some embodiments of the present disclosure. As illustrated in the flowchart, the control logic 1200 includes the step of issuing long or DCS write packets with predetermined data from host to peripheral at step 1201 and issuing long or DCS read packets from host to peripheral at step 1202. The above steps are performed by the low power adjust module by writing control-data and read requests data to DSI/CSI host controller control-data path respectively. The control logic 1200 further includes the steps of performing bus turn around by the host at step 1203 by the DSI/CSI host controller and waiting till read data is received from peripheral to host or bus turn around count times out in host at step 1204 by the DSI/CSI host controller and the low power adjust module. The control logic 1200 further includes the step of checking at step 1205 whether read data received at step 1204 matches with write data sent at step 1201. If the check at step 1205 fails, then the control logic 1200 includes the step of updating host low power clock frequency to a lower or higher frequency than previously set or updated frequency at step 1206. The above step is performed in the low power adjust module and will drive parameters to the clock parameter compute module. Additionally, if the check at step 1205 is successful, then the control logic 1200 includes the step of determining host low power clock frequency range at step 1207. The above step involves assigning set or updated host clock frequency at which host and peripheral low power link works as initial frequency of the range. The final and typical frequency is determined based on the initial frequency and one or more predetermined ratios. For example, in one embodiment, the set or the updated host clock frequency at which host and peripheral low power link works is assigned as the maximum frequency of the range. The typical frequency is then calculated by multiplying maximum frequency and predetermined typical to maximum guard ratio. Similarly, minimum frequency is calculated by multiplying calculated typical frequency and predetermined minimum to typical guard ratio. The above step is performed in the low power adjust module.

Figure 13:
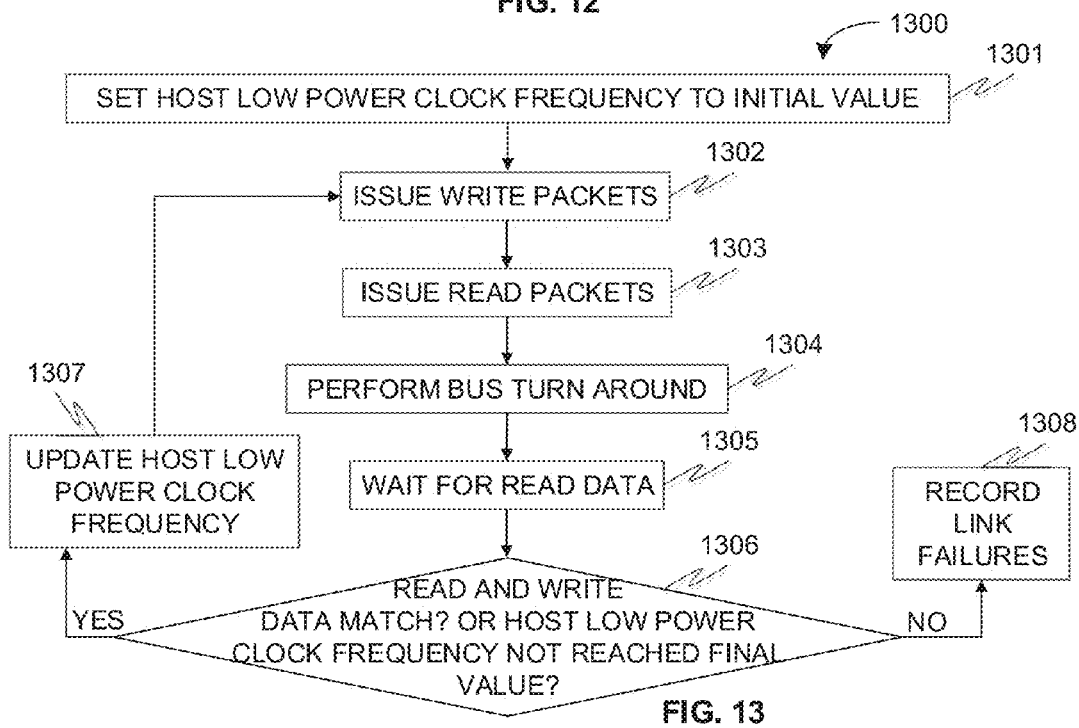
FIG. 13 is a flow diagram of a detailed exemplary process for assessing the host-peripheral low power link in the host low power clock frequency range of FIG. 11 in accordance with some embodiments of the present disclosure.

Referring now to FIG. 13, exemplary control logic 1300 for assessing the host-peripheral low power link in the host low power clock frequency range at step 1105 is depicted in greater detail via a flowchart in accordance with some embodiments of the present disclosure. As illustrated in the flowchart, the control logic 1300 includes the steps of setting the host low power clock starting frequency to assigned maximum or minimum value at step 1301. The above step is performed in the low power adjust module and will drive parameters to the clock parameter compute module. The control logic 1300 further includes the steps of issuing long or DCS write packets with predetermined data from host to peripheral at step 1302 and issuing long or DCS read packets from host to peripheral at step 1303. The above steps are performed by the low power adjust module by writing control-data and read requests data to DSI/CSI host controller control-data path respectively. The control logic 1300 further includes the steps of performing bus turn around by the host at step 1304 by the DSI/CSI host controller and waiting till read data is received from peripheral to host or bus turn around count times out in host at step 1305 by the DSI/CSI host controller and the low power adjust module. The control logic 1300 further includes the step of checking at step 1306 whether read data received at step 1305 matches with write data sent at step 1302 or whether host low power clock frequency not reached calculated minimum or maximum value. If the check at step 1306 is successful, then the control logic 1300 includes the step of updating host low power clock frequency to a lower or higher frequency than previously set or updated frequency at step 1307. The above step is performed in the low power adjust module and will drive parameters to the clock parameter compute module. Additionally, if the check at step 1306 fails, then the control logic 1300 includes the step of recording any low power link failure between host and peripheral and also recording the host low power clock frequency set or updated at which the failure occurred at step 1308. The above step is performed in the low power adjust module.

Figure 14:
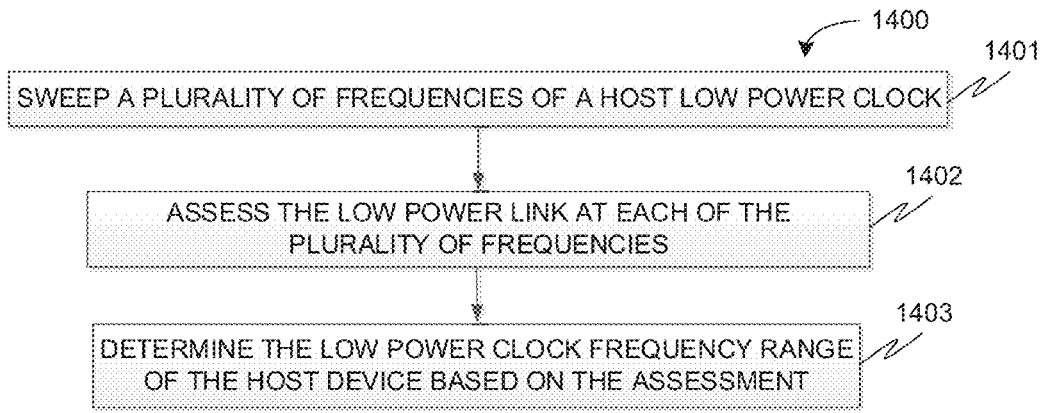
FIG. 14 is a flow diagram of another exemplary process for determining a host low power clock frequency range in which a host-peripheral low power link is operational in accordance with some embodiments of the present disclosure.

As stated above, a variety of processes may be employed for determining a host low power clock frequency range in which a host-peripheral low power link is operational at step 902. Referring now to FIG. 14, another exemplary control logic 1400 for determining a host low power clock frequency range in which a host-peripheral low power link is operational is depicted via a flowchart in accordance with some embodiments of the present disclosure. As illustrated in the flowchart, the control logic 1400 includes the steps of sweeping a plurality of frequencies of a host low power clock at step 1401, assessing the low power link between the host device and a peripheral device at each of the plurality of frequencies at step 1402, and determining the low power clock frequency range of the host device based on the assessment at step 1403.

As noted above, in certain embodiments, sweeping the plurality of host low power clock frequencies at step 1401 comprises setting, at a first instance, the low power clock frequency to a pre-determined frequency and iteratively setting, at a subsequent instance, the low power clock frequency to an updated frequency. Further, in certain embodiments, assessing the low power link at each of the plurality of frequencies at step 1402 may further include the steps of initiating a write command from the host device to write data on at least one register of the peripheral device, initiating a read command by the host device to read data from the at least one register of the peripheral device, and comparing the read data with the write data for a data parity. Further, in certain embodiments, determining the low power clock frequency range at step 1403 comprises determining the initial frequency and the final frequency within which the low power link was operational.

Figure 15:
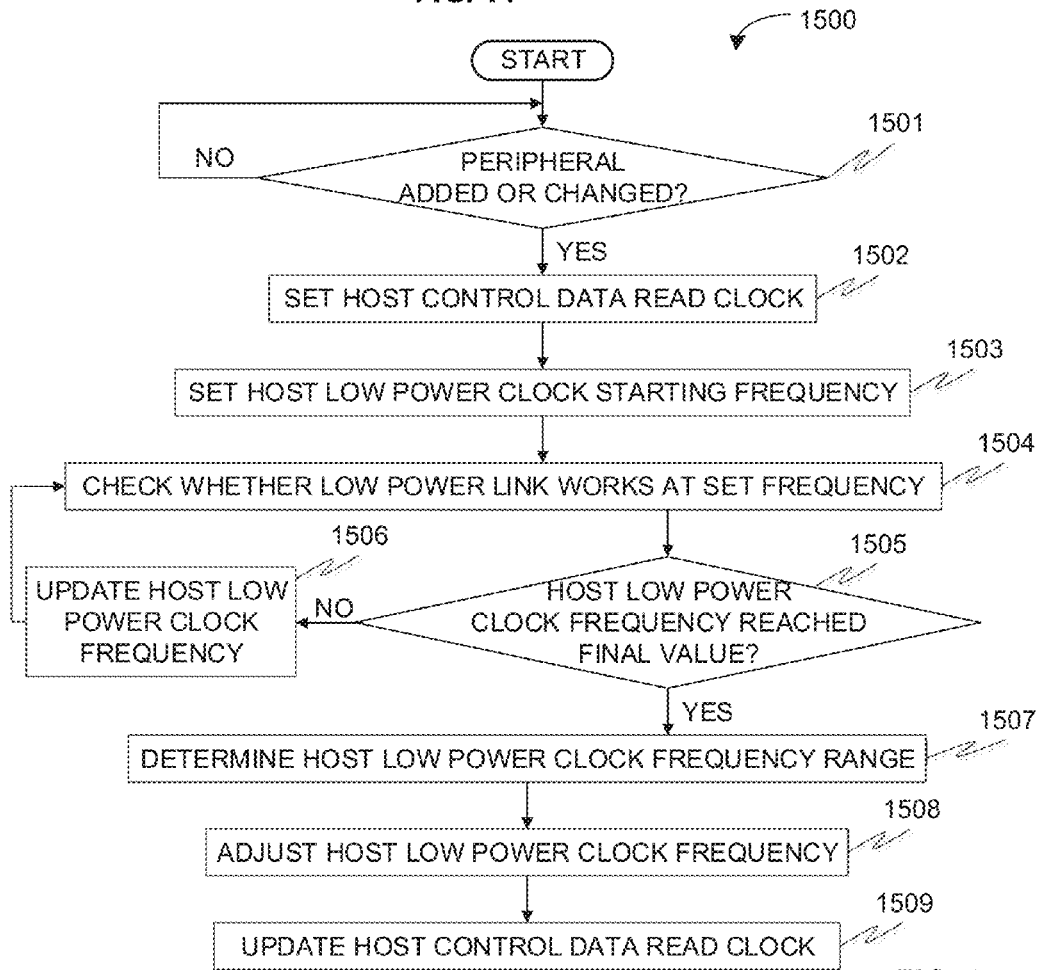
FIG. 15 is a flow diagram of a detailed exemplary process of FIG. 9 using process of FIG. 14 in accordance with some embodiments of the present disclosure.

Referring now to FIG. 15, exemplary control logic 1500 for dynamically adjusting a host low power clock frequency is depicted via a flowchart in accordance with some embodiments of the present disclosure. The control logic 1500 depicts in greater detail the control logic 900 which employs the control logic 1400. As illustrated in the flowchart, the control logic 1500 includes the steps of checking whether a new peripheral is added or existing peripheral is changed at step 1501, setting host control-data read clock to host low power clock at step 1502, setting host low power clock starting frequency to a predetermined highest or lowest value allowed at step 1503, assessing the host-peripheral low power link at the set frequency i.e., checking whether low power link between host and peripheral works at the set frequency at step 1504, and checking whether host low power clock frequency has reached final value (lowest or highest depending on starting frequency) at step 1505. If the check at step 1505 fails, then the control logic 1500 includes the step of updating host low power clock frequency to a lower or higher frequency than the previously set frequency at step 1506. The control then flows back to step 1504 and the process is iteratively repeated till sweeping of a plurality of host low power clock frequencies. If the check at step 1505 is successful, then the control logic 1500 includes the steps of determining the host low power clock frequency range at step 1507, adjusting host low power clock frequency to a typical frequency of the host low power clock frequency range at step 1508, and updating or resetting host control-data read clock to host receive (Rx) low power clock at step 1509.

As will be also appreciated, the above described techniques may take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention. The disclosure may also be embodied in the form of computer program code or signal, for example, whether stored in a storage medium, loaded into and/or executed by a computer or controller, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

Figure 16:
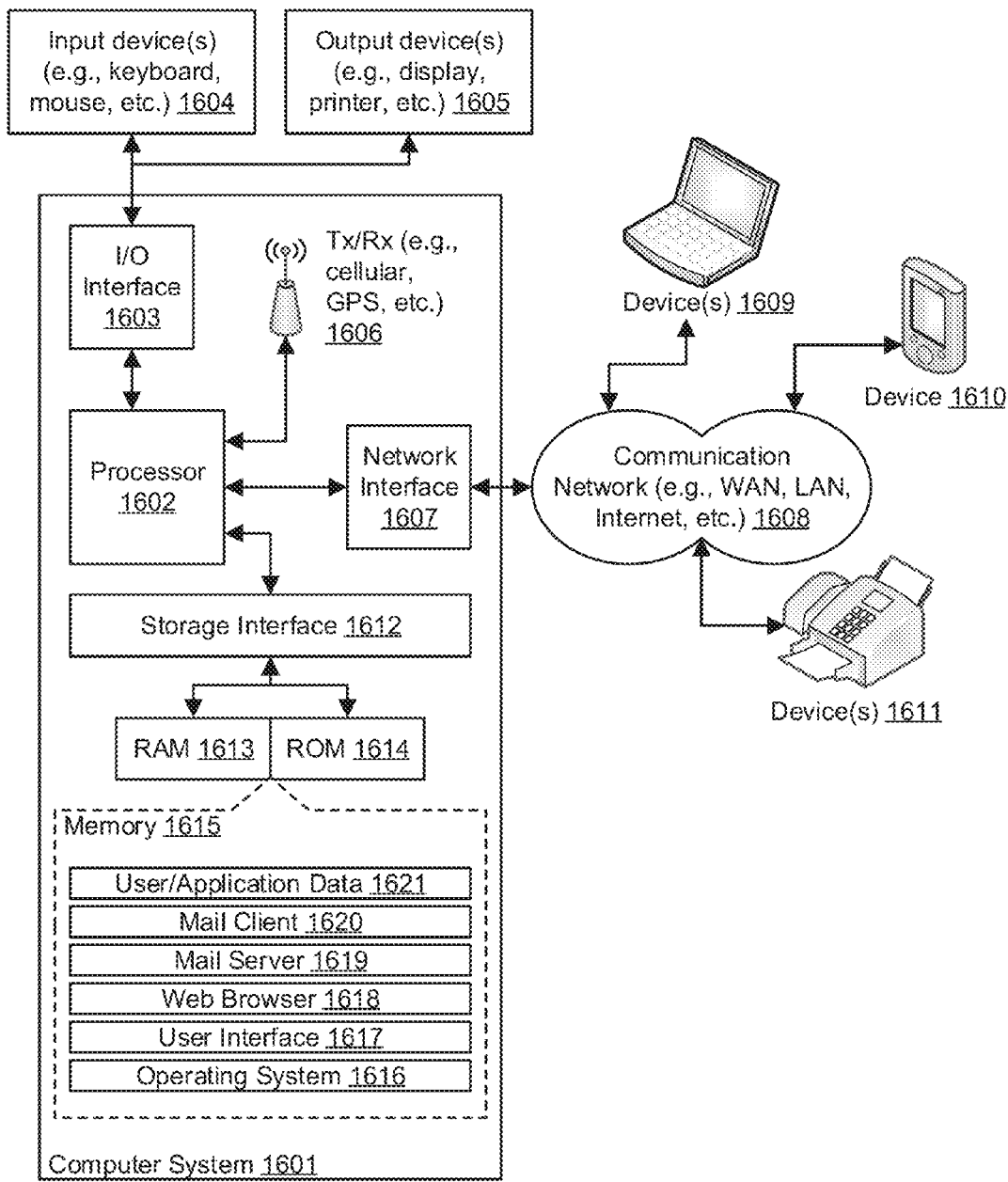
FIG. 16 is a block diagram of an exemplary computer system for implementing embodiments consistent with the present disclosure.

Referring now to FIG. 16, a block diagram of an exemplary computer system 1601 for implementing embodiments consistent with the present disclosure is illustrated. Variations of computer system 1601 may be used for implementing a mobile device or a computing device comprising of a host and at least one peripheral wherein techniques for dynamically adjusting the host low power clock frequency upon detecting a coupling of a peripheral device to the host device and without depending on a peripheral low power clock frequency may be practiced. Computer system 1601 may comprise a central processing unit ("CPU" or "processor") 1602. Processor 1602 may comprise at least one data processor for executing program components for executing user- or system-generated requests. A user may include a person, a person using a device such as such as those included in this disclosure, or such a device itself. The processor may include specialized processing units such as integrated system (bus) controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. The processor 1602 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 1602 may be disposed in communication with one or more input/output (I/O) devices via I/O interface 1603. The I/O interface 1603 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using the I/O interface 1603, the computer system 1601 may communicate with one or more I/O devices. For example, the input device 1604 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc. Output device 1605 may be a printer, fax machine, video display (e.g., cathode ray tube (CRT), liquid crystal display (LCD), light-emitting diode (LED), plasma, or the like), audio speaker, etc. In some embodiments, a transceiver 1606 may be disposed in connection with the processor 1602. The transceiver may facilitate various types of wireless transmission or reception. For example, the transceiver may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, the processor 1602 may be disposed in communication with a communication network 1608 via a network interface 1607. The network interface 1607 may communicate with the communication network 1608. The network interface may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. The communication network 1608 may include, without limitation, a direct interconnection, local area network (LAN), wide area network (WAN), wireless network (e.g., using Wireless Application Protocol), the Internet, etc. Using the network interface 1607 and the communication network 1608, the computer system 1601 may communicate with devices 1610, 1611, and 1612. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, the computer system 1601 may itself embody one or more of these devices.

In some embodiments, the processor 1602 may be disposed in communication with one or more memory devices (e.g., RAM 1613, ROM 1614, etc.) via a storage interface 1612. The storage interface may connect to memory devices including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc.

The memory devices may store a collection of program or database components, including, without limitation, an operating system 1616, user interface application 1617, web browser 1618, mail server 1619, mail client 1620, user/application data 1621 (e.g., any data variables or data records discussed in this disclosure), etc. The operating system 1616 may facilitate resource management and operation of the computer system 1601. Examples of operating systems include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 1617 may facilitate display, execution, interaction, manipulation, or operation of program components through textual or graphical facilities. For example, user interfaces may provide computer interaction interface elements on a display system operatively connected to the computer system 1601, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Flash, etc.), or the like.

In some embodiments, the computer system 1601 may implement a web browser 1618 stored program component. The web browser may be a hypertext viewing application, such as Microsoft Internet Explorer, Google Chrome, Mozilla Firefox, Apple Safari, etc. Secure web browsing may be provided using HTTPS (secure hypertext transport protocol), secure sockets layer (SSL), Transport Layer Security (TLS), etc. Web browsers may utilize facilities such as AJAX, DHTML, Adobe Flash, JavaScript, Java, application programming interfaces (APIs), etc. In some embodiments, the computer system 1601 may implement a mail server 1619 stored program component. The mail server may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as internet message access protocol (IMAP), messaging application programming interface (MAPI), Microsoft Exchange, post office protocol (POP), simple mail transfer protocol (SMTP), or the like. In some embodiments, the computer system 1601 may implement a mail client 1620 stored program component. The mail client may be a mail viewing application, such as Apple Mail, Microsoft Entourage, Microsoft Outlook, Mozilla Thunderbird, etc.

In some embodiments, computer system 1601 may store user/application data 1621, such as the data, variables, records, etc. (e.g., maximum frequency of host low power clock, a maximum-typical-minimum frequency of the range of the host low power clock frequency, pre-determined write data pattern, and so forth) as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of the any computer or database component may be combined, consolidated, or distributed in any working combination.

As will be appreciated by those skilled in the art, the techniques described in the various embodiments discussed above results in automatic adjustment of host low power clock frequency, without depending on peripheral low power clock frequency, in a dynamic manner, whenever a new peripheral is coupled to a host or an existing peripherals connected to the host is changed. Even knowledge of peripheral low power clock frequency is not required for adjustment of host low power clock frequency. Further, the proposed system and method achieves faster and error-free way of adjusting host low power clock frequency. As will be appreciated by those skilled in the art, the disclosed system and method for automated adjustment of host low power clock frequency within the predetermined range of that of peripheral clock frequency in a dynamic manner results in elimination of link failures between the mobile host processor and its peripheral devices. These advantages are achieved by dynamically adjusting host low power clock frequency by real-time determination of valid range in which link continues to work during sweeping of host low power clock frequencies and subsequent allocation of valid frequency to host low power clock from within the determined range.

The specification has described system and method for dynamically adjusting a low power clock frequency of a host device. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method for dynamically adjusting a low power clock frequency of a host device, the method comprising:
   dynamically determining an initial frequency of a low power clock of the host device at which a low power link between the host device and a peripheral device is operational, wherein the initial frequency is determined by sweeping a plurality of frequencies of the low power clock of the host device, and wherein the sweeping comprises: setting, at a first instance, the low power clock frequency to a pre-determined frequency, and iteratively setting, at a subsequent instance, the low power clock frequency to an updated frequency;
   computing a low power clock frequency range of the host device based on the initial frequency of the low power clock;
   assessing the low power link in the low power clock frequency range; and
   adjusting the low power clock frequency to a typical frequency of the low power clock frequency range based on the assessment, wherein the adjustment of low power clock frequency of the host device is independent of a low power clock frequency of the peripheral device.

2. The method of claim 1, further comprising detecting a coupling of the peripheral device to the host device.

3. The method of claim 1, further comprising setting a control-data read clock of the host device to the low power clock of the host device.

4. The method of claim 1, wherein dynamically determining the initial frequency of the low power clock comprises:
   assessing the low power link at each of the plurality of frequencies; and
   determining the initial frequency of the low power clock based on the assessment.

5. The method of claim 4, wherein assessing the low power link at each of the plurality of frequencies comprises:
   initiating a write command from the host device to write data on at least one register of the peripheral device;
   initiating a read command by the host device to read data from the at least one register of the peripheral device; and
   comparing the read data with the write data for a data parity.

6. The method of claim 4, wherein determining the initial frequency of the low power clock comprises determining a frequency from the plurality of frequencies at which a data parity occurred while assessing.

7. The method of claim 1, wherein computing the low power clock frequency range comprises determining a maximum, a minimum, and a typical low power clock frequencies based on the initial frequency of the low power clock and one or more predetermined ratios.

8. The method of claim 1, wherein assessing the low power link in the low power clock frequency range comprises assessing the low power link for each of a set of frequencies selected from within the low power clock frequency range by:
   initiating a write command from the host device to write data on at least one register of the peripheral device;

initiating a read command by the host device to read data from the at least one register of the peripheral device; and comparing the read data with the write data for a data parity.

9. The method of claim 1, wherein adjusting comprises adjusting the low power clock frequency to the typical frequency of the low power clock frequency range for which a data parity occurred throughout the low power clock frequency range while assessing.

10. The method of claim 1, further comprising resetting a control-data read clock of the host device to a receive low power clock of the host device.

11. A system, comprising:
a circuitry for dynamically adjusting a low power clock frequency of a host device by performing operations comprising:
dynamically determining an initial frequency of a low power clock of the host device at which a low power link between the host device and a peripheral device is operational, wherein the initial frequency is determined by sweeping a plurality of frequencies of the low power clock of the host device, and wherein the sweeping comprises setting, at a first instance, the low power clock frequency to a pre-determined frequency and iteratively setting, at a subsequent instance, the low power clock frequency to an updated frequency;
computing a low power clock frequency range of the host device based on the initial frequency of the low power clock;
assessing the low power link in the low power clock frequency range; and
adjusting the low power clock frequency to a typical frequency of the low power clock frequency range based on the assessment, wherein the adjustment of low power clock frequency of the host device is independent of a low power clock frequency of the peripheral device.

12. The system of claim 11, wherein the operations further comprise detecting a coupling of the peripheral device to the host device.

13. The system of claim 11, wherein dynamically determining the initial frequency of the low power clock comprises:
assessing the low power link at each of the plurality of frequencies; and
determining the initial frequency of the low power clock based on the assessment.

14. The system of claim 13, wherein assessing the low power link at each of the plurality of frequencies comprises:
initiating a write command from the host device to write data on at least one register of the peripheral device;
initiating a read command by the host device to read data from the at least one register of the peripheral device; and
comparing the read data with the write data for a data parity.

15. The system of claim 13, wherein determining the initial frequency of the low power clock comprises determining a frequency from the plurality of frequencies at which a data parity occurred while assessing.

16. The system of claim 13, wherein computing the low power clock frequency range comprises determining a maximum, a minimum, and a typical low power clock frequencies based on the initial frequency of the low power clock and one or more predetermined ratios.

17. The system of claim 11, wherein assessing the low power link in the low power clock frequency range comprises assessing the low power link for each of a set of frequencies selected from within the low power clock frequency range by:
initiating a write command from the host device to write data on at least one register of the peripheral device;
initiating a read command by the host device to read data from the at least one register of the peripheral device; and
comparing the read data with the write data for a data parity.

18. The system of claim 11, wherein adjusting comprises adjusting the low power clock frequency to the typical frequency of the low power clock frequency range for which a data parity occurred throughout the low power clock frequency range while assessing.

19. The system of claim 11, wherein the system comprises a mobile device, the circuitry comprises a mobile industry processor interface (MIPI) circuitry; the host device comprises a MIPI host device, and the peripheral device comprises a MIPI peripheral device.

20. A non-transitory computer-readable medium storing processor-executable instructions for:
dynamically determining an initial frequency of a low power clock of the host device at which a low power link between the host device and a peripheral device is operational, wherein the initial frequency is determined by sweeping a plurality of frequencies of the low power clock of the host device, and wherein the sweeping comprises setting, at a first instance, the low power clock frequency to a pre-determined frequency and iteratively setting, at a subsequent instance, the low power clock frequency to an updated frequency;
computing a low power clock frequency range of the host device based on the initial frequency of the low power clock;
assessing the low power link in the low power clock frequency range; and
adjusting the low power clock frequency to a typical frequency of the low power clock frequency range based on the assessment, wherein the adjustment of low power clock frequency of the host device is independent of a low power clock frequency of the peripheral device.

* * * * *